United States Patent
Berzins et al.

(10) Patent No.: US 6,781,465 B1
(45) Date of Patent: Aug. 24, 2004

(54) METHOD AND APPARATUS FOR DIFFERENTIAL SIGNAL DETECTION

(75) Inventors: Matthew S. Berzins, Austin, TX (US); Charles A. Cornell, Austin, TX (US); Stephen M. Prather, Austin, TX (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 10/318,543

(22) Filed: Dec. 13, 2002

(51) Int. Cl.[7] .............................................. H03F 3/45
(52) U.S. Cl. ...................................... 330/258; 330/69
(58) Field of Search .................................. 330/258, 69

(56) References Cited

U.S. PATENT DOCUMENTS

| | | | | |
|---|---|---|---|---|
| 4,377,789 A | * | 3/1983 | Hoover | 330/253 |
| 5,663,680 A | * | 9/1997 | Nordeng | 330/9 |
| 5,703,532 A | * | 12/1997 | Shin et al. | 330/253 |
| 5,939,904 A | * | 8/1999 | Fetterman et al. | 327/67 |
| 6,188,282 B1 | * | 2/2001 | Montalvo | 330/260 |
| 6,194,965 B1 | | 2/2001 | Kruczkowski et al. | |

* cited by examiner

Primary Examiner—Patricia Nguyen
(74) Attorney, Agent, or Firm—Marger Johnson & McCollom, P.C.

(57) ABSTRACT

Embodiments of the invention describe a method and apparatus for detecting valid differential signals with half the number of differential amplifiers required by conventional methods. By purposely mismatching an otherwise matched differential pair, a self-induced DC offset voltage is created and the additional circuitry required to generate external reference voltages according to conventional methods is eliminated. Embodiments of the invention also have improved noise rejection characteristics and enhanced high-speed capability compared to conventional circuits.

24 Claims, 5 Drawing Sheets

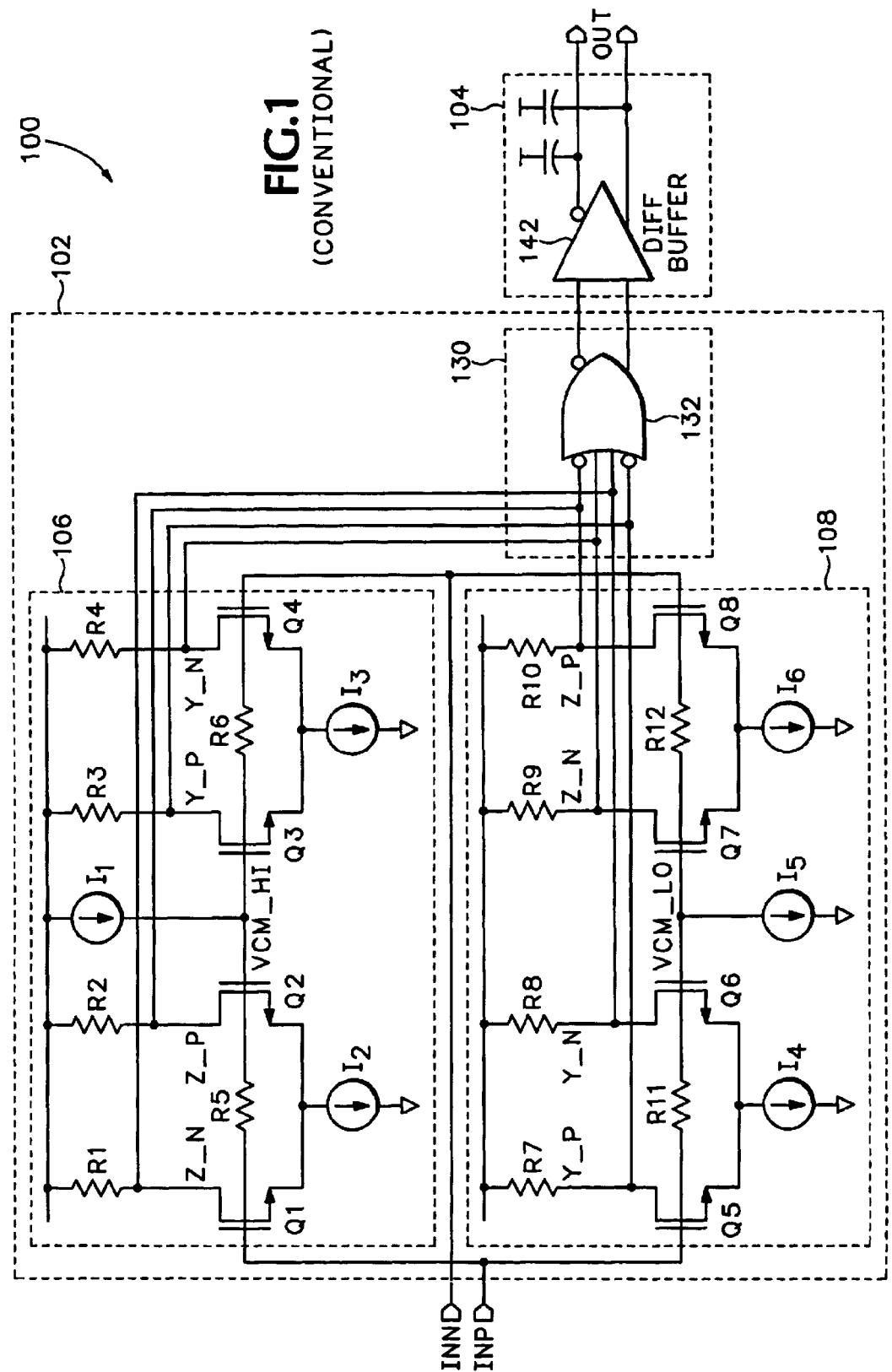
FIG.1
(CONVENTIONAL)

METHOD AND APPARATUS FOR DIFFERENTIAL SIGNAL DETECTION

BACKGROUND OF THE INVENTION

1. Field of the Invention

This disclosure pertains generally to a detection circuit and, in particular, to a method and apparatus for detecting differential signal levels using a circuit having a self-induced DC offset.

2. Description of the Related Art

FIG. 1 is a circuit diagram of a conventional differential signal detection circuit 100 described in U.S. Pat. No. 6,194,965 B1 issued to Kruczkowski et al. on Feb. 27, 2001 (hereafter the '965 patent) and assigned to Cypress Semiconductor Corp.

The circuit 100 includes a differential amplifier stage 102 and an output circuit 104. The output circuit 104 includes a differential buffer 142. The differential amplifier stage 102 includes a logic circuit 130 composed of a differential OR gate 132.

The differential amplifier stage 102 of circuit 100 uses four matched differential amplifiers. One of the four matched differential amplifiers is composed of resistors R1, R2, and R5; field-effect transistors (FETs) Q1 and Q2, and a current source 12 to bias the transistors Q1 and Q2. The other three matched differential amplifiers in differential amplifier stage 102 have the same structure but are made from other components. The top two of the matched differential amplifiers make up a pair circuit 106 and the other two make up a pair circuit 108.

The circuit 100 requires external references VCM_HI and VCM_LO, to perform the signal detect process. The current source 11 and the resistors R5, R6 create common mode voltage VCM_HI in the pair circuit 106, while the current source 15 and the resistors R11, R12 create another common mode voltage VCM_LO in the pair circuit 108. Four comparisons are made to perform the signal detect process in circuit 100, one for each matched differential amplifier. Signals taken from nodes Z_N, Z_P, Y_N, and Y_P from the pair circuits 106 and 108 form the inputs to the differential OR gate 132.

Embodiments of the invention improve upon the conventional circuit by eliminating the need for the common mode voltages VCM_HI and VCM_LO, which decreases noise susceptibility. Embodiments of the invention also improve upon the conventional circuit by reducing circuit area and power consumption.

SUMMARY OF THE INVENTION

Embodiments of the invention provide a differential signal detection device and an indication circuit. A particular embodiment includes at least two differential amplifiers that are purposely mismatched so that one leg of each amplifier is different than the other leg in the same amplifier. This gives the differential amplifiers a non-symmetric characteristic.

Other embodiments of the invention provide a data bus signal level detection system. The system includes first and second input terminals coupled to first and second signal lines of a data bus, and first and second differential amplifiers coupled to both the first and second input terminals. An indication circuit produces signals based upon the output from the first and second differential amplifiers. The differential amplifiers each have a first leg with a first set of components and second leg with a second set of components, but the first and second set of components do not match.

A method for detecting differential signals is also provided. First and second differential input signals are applied to purposely mismatched differential amplifiers. The differential amplifiers are mismatched because the leg of one branch of the amplifier is non-symmetric when compared to the other leg of the amplifier. The output signals from the differential amplifiers are then compared in a logic circuit that produces an output based on that comparison.

BRIEF DESCRIPTION OF THE DRAWINGS

FIG. 1 is a circuit diagram of a conventional differential signal detection circuit.

DETAILED DESCRIPTION OF THE INVENTION

Embodiments of the invention provide at least two purposely non-symmetric differential amplifier circuits, each an offset that unbalances the symmetry of an otherwise matched differential amplifier. A pair of signals with a differential-mode component is respectively applied to the differential amplifier inputs. By comparing the output of the differential amplifier circuits with a differential logic circuit, embodiments of the invention detect the amount that the input signals oppose one another. In some applications, such as for USB circuits, data is validated only if the signals oppose one another by a predetermined amount. By setting the amount of offset in the pair of differential circuits, any amount of signal opposition can be effectively measured. Embodiments of the invention additionally allow for the differential circuits to be tuned, providing a high degree of precision.

Figure 2:
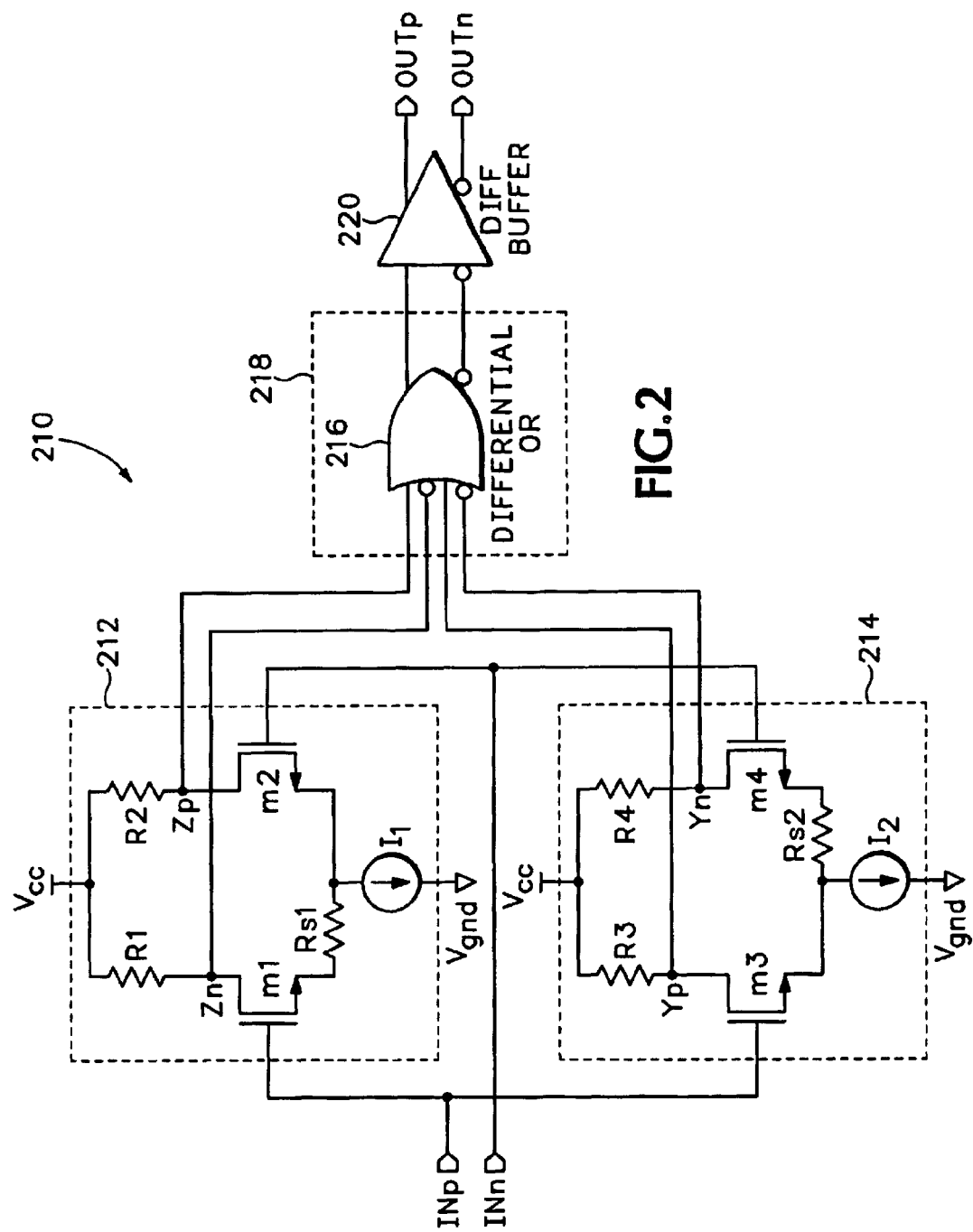
FIG. 2 is a circuit diagram for a differential signal detection circuit according to an embodiment of the invention.

FIG. 2 is a circuit diagram for a differential signal detection circuit 210 according to an embodiment of the invention. Although embodiments of the invention can be tailored to measure a differential signal from data lines of a Universal Serial Bus (USB) line, for instance, the invention has a broader application than only that application.

The differential signal detection circuit 210 shown in FIG. 2 includes unmatched differential pair sets 212 and 214, a logic circuit 218, and a differential buffer 220. In this embodiment, the logic circuit 218 is a differential OR gate 216. Other differential logic gates or combinations of gates may be used, depending on the desired application.

The unmatched differential amplifier 212 includes resistances R1 and R2, a source resistance Rs1, a current source I1, and transistors m1 and m2. The unmatched differential amplifier 214 similarly includes resistances R3 and R4, a source resistance Rs2, a current source I2, and transistors m3 and m4. The transistors m1, m2 and m3, m4 implement matched differential pairs. Although in FIG. 2 the differential pairs m1, m2 and m3, m4 are formed of NMOS Field Effect Transistors (FETs), any type of transconductance device can be used. For example, some other devices that might be used include PMOS FETs, NPN BJTs (Bi-Polar Junction Transistors), or PNP BJTs, etc. In this embodiment, the resistances R1, R2, R3, and R4 are illustrated as passive loads, but alternative embodiments may utilize active loads. For example, resistances R1, R2, R3, and R4 may be implemented by transistors operating in their resistive zone. This would allow dynamic control of the resistances during circuit operation, if desired. In this embodiment, the unmatched differential amplifiers 212, 214 would otherwise be matched differential amplifiers if not for the addition of the source resistances Rs1, Rs2 in one of their branches. Adding the source resistances Rs1, Rs2 gives the mismatched differential amplifiers 212, 214 a non-symmetric characteristic. Similar to the other resistances, the source resistances Rs1 and Rs2 can be made from active devices.

The drains of the FETs m1, m2, m3, and m4 are coupled to an operating voltage Vcc through resistances R1, R2, R3, and R4, respectively. The current sources I1, I2 are respectively coupled between the branches of unmatched differential amplifiers 212, 214 and a ground reference voltage Vgnd. A nominal input signal INn is coupled to the gates of FETs m2 and m4, while an opposite phase input signal INp is coupled to the gates of FETs m1 and m3. A set of circuit nodes Zn, Zp, Yn, and Yp function as inputs to the differential OR gate 216.

In an example embodiment of the detection circuit 210, the resistances R1, R2, R3, R4 are substantially equal and have values between 3–5 k$\Omega$. The current sources I1 and I2 produce substantially equivalent currents between 200 and 500 $\mu$A. The source resistances Rs1, Rs2 are substantially equal and have values between 100–250 $\Omega$. However, in other embodiments of the invention the source resistances Rs1, Rs2 may be unequal, and, of course, the other values may be different.

The addition of a source resistance Rs1 and Rs2 to otherwise matched differential amplifiers to form unmatched differential amplifiers 212, 214 creates a self-induced DC offset, or "internal" reference voltage. With a self-induced DC offset there is no need to generate external reference voltages, as the differential amplifiers are self-compensating. For example, a comparison of FIGS. 1 and 2 reveals that the source resistance Rs1 in FIG. 2 eliminates the need for current source I1 and the voltage bias resistors R5 and R6 in the pair circuit 106 of FIG. 1. Similarly, the presence of source resistance Rs2 in the unmatched differential amplifier 214 of the detection circuit 210 eliminates the need for the current source I5 and bias resistors R11 and R12 in the pair circuit 108 (FIG. 1). The self-induced DC offset voltage of the detection circuit 210 of FIG. 2 also eliminates half of the number of differential amplifiers required by previous detection circuits, and in turn, reduces the power supply current and circuit area required.

The difference between the input signals INn and INp is called the differential-mode of the input. The common-mode of the input signals INn and INp is the average value of the two signals. Pure differential-mode signals have equal magnitude but opposite polarity at all times. In general, differential amplifiers respond in different ways to the differential-mode and common-mode components of its input signals.

In operation, the detection circuit 210 of FIG. 2 detects when the applied differential input signals INp and INn have a pre-determined amount of offset. If the difference between the input signals INp and INn is greater than the pre-determined offset, then one pair of differential amplifier outputs Zn, Zp or Yp, Yn will also have a difference greater than the pre-determined offset. Differential OR gate 216 checks this condition, and returns OUTp at a high voltage level if that condition is met. Differential buffer 220 buffers the output from differential OR gate 216.

For instance, with reference to FIG. 2, if the input signal INp is HIGH and the signal INn is LOW, then, in the differential amplifier 212, the transistor m1 tends to be turned ON while the transistor m2 remains OFF. However, the input signal INp must be high enough to overcome the built in mismatch caused by the resistance Rs1. If the signal INp is high enough, the transistor m1 turns ON and node Zn is pulled LOW while node Zp remains HIGH, because it is coupled to Vcc through the resistor R2. Similarly, in the differential amplifier 214, the HIGH signal INp turns on transistor m3 while the LOW signal INn turns the transistor m4 OFF. In the differential amplifier 214, the mismatch caused by the resistance Rs2 does not prevent the transistor m4 from remaining OFF. Thus, the node Yp is LOW and the node Yn is HIGH. These signals from the nodes Zn, Zp, Yp, and Yn are routed through the differential OR gate 216, which generates the proper output signal. In general, if the input signal INp is higher than the input signal INn by the threshold amount caused by Rs1, or if the input signal INn is higher than the input signal INp by the threshold amount caused by Rs2, then the detection circuit 210 generates a signal that indicates the input signals are valid.

There are many other ways to induce an internal DC offset besides using source resistances Rs1, Rs2 as shown in FIG. 2. The same non-symmetric effect may be achieved by mismatching the FET or BJT differential pairs (m1$\neq$m2, m3$\neq$m4). A self-induced internal DC offset may alternatively be accomplished by mismatching the passive loads (R1$\neq$R2, R3$\neq$R4), or, in other embodiments, mismatching the active loads. Alternatively, the gate voltages for the matched differential pairs could be mismatched.

In the embodiment illustrated in FIG. 2, the sources of the otherwise matched differential pairs are mismatched by adding a source resistance Rs1, Rs2. However, nonsymmetry may also be achieved by mismatching the drain side of the FETs m1, m2 and FETs m3, m4. In embodiments that utilize BJTs, mismatching the bases, collectors, or emitters may create a self-induced DC offset as well.

Detection circuits according to embodiments of the invention, such as the detection circuit 210 shown in FIG. 2, improve upon the conventional circuit in other ways besides a reduction in power supply current and circuit area. For example, parasitic loading is reduced and input signals can propagate through the detection circuit 210 of FIG. 2 quicker than previous detection circuits. Thus, the detection circuit 210 has an improved bandwidth and is well-suited for high speed applications. Inducing an internal DC offset voltage, rather than using external voltage references, also allows the inherently beneficial properties of the differential amplifiers to be utilized—properties such as high power supply noise rejection ratios and high common mode noise rejection characteristics. As a result, fewer false triggers occur. An additional benefit achieved by reducing the number of differential pairs compared to conventional circuits is that it simplifies the task of matching differential amplifiers.

Uses for embodiments of the invention are numerous. For example, the embodiment shown in FIG. 2 can detect a valid/invalid signal level for a transmitted differential signal. When the voltage amplitude of the differential signal exceeds the self-induced offset voltage of the detection circuit 210, the output circuit produces an output signal to indicate that the input data is valid. Conversely, if the voltage amplitude of the differential signal does not exceed the self-induced offset voltage, the output circuit produces an output signal that indicates the input data is not valid. Thus, the detection circuit 210 indicates valid signal activity from the differential inputs or differential signal loss over a period of time.

By implementing an opposite phase differential pair and a post-detection OR function, data may be peak detected. The signal detect indication is produced when the OR'd input signals exceed a differential voltage level threshold of a transmitted differential signal. The differential circuit 210 can also be used to indicate that data is invalid when the amplitude of a USB differential signal at a receiver's inputs falls below a squelch threshold.

Figure 3:
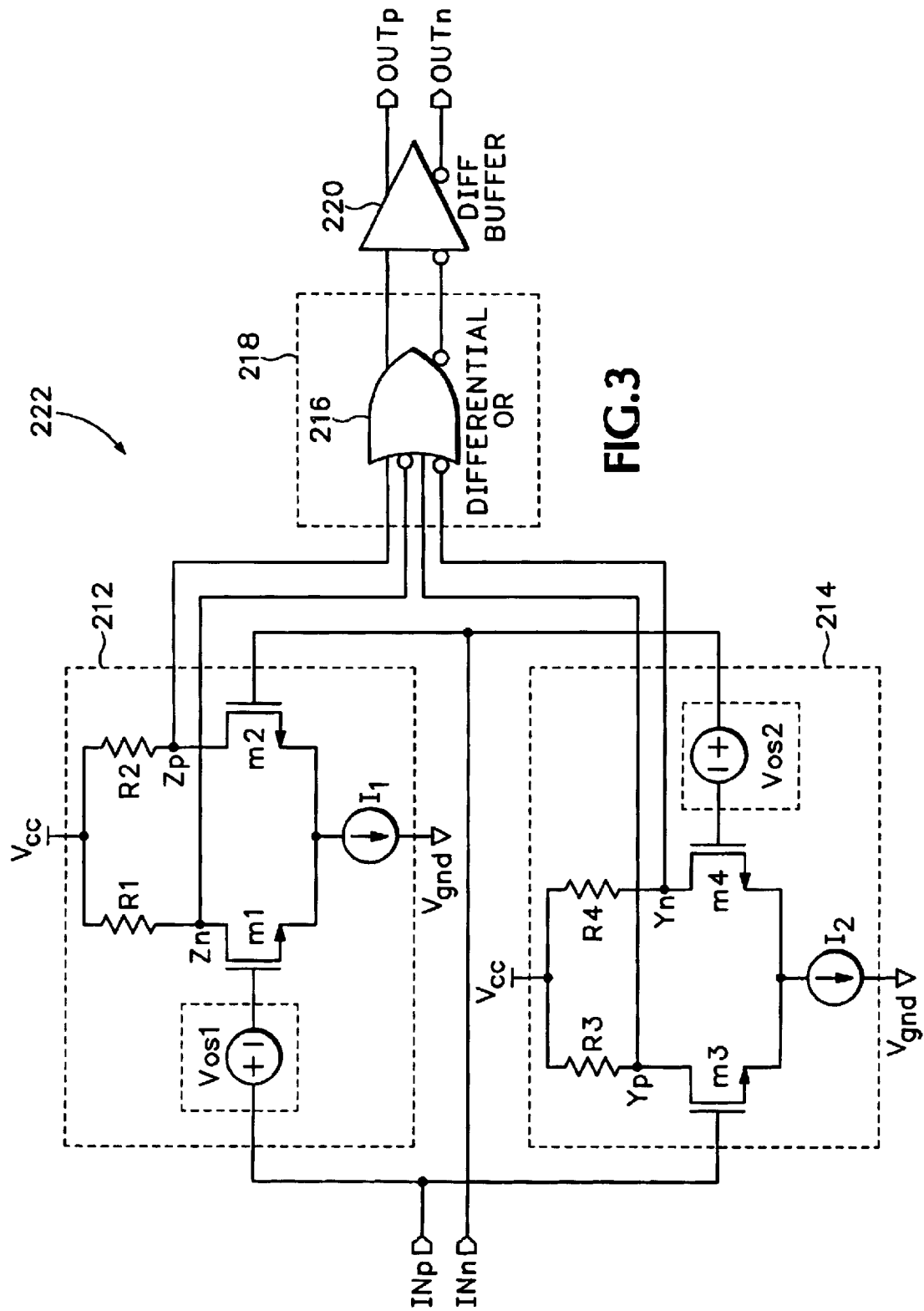
FIG. 3 is an equivalent circuit model for the circuit shown in FIG. 2.

FIG. 3 is an equivalent circuit model 222 of the detection circuit 210 shown in FIG. 2, and helps to further explain the operation of the detection circuit. The equivalent circuit 222 includes the same elements as circuit 10, except that the source resistances Rs1 and Rs2 of FIG. 2 have been replaced by equivalent DC offset voltages Vos1 and Vos2, respectively. These DC offset voltages Vos1 and Vos2 are illustrated as being coupled to the gales of the FETs m1 and m4 in FIG. 3. In FIG. 2, when the voltages at the gates of the differential pairs 212, 214 are equal, the anti-symmetric source resistances Rs1 and Rs2 force unequal currents through the differential amplifiers 212, 214. Likewise, in FIG. 3, the DC offset voltages Vos1, Vos2 force unequal currents through the differential pairs 212, 214. If the source resistances Rs1, Rs2 in FIG. 2 are equivalent to one another, then the DC offset voltages Vos1, Vos2 in FIG. 3 are equivalent to each other as well. A threshold is reached when the voltages of the signal inputs INn and INp differ by the amount of the offset voltage introduced by Vos1 and Vos2, because at that point the currents through the branches of one of the differential amplifiers 212, 214 are equal.

Figure 4:
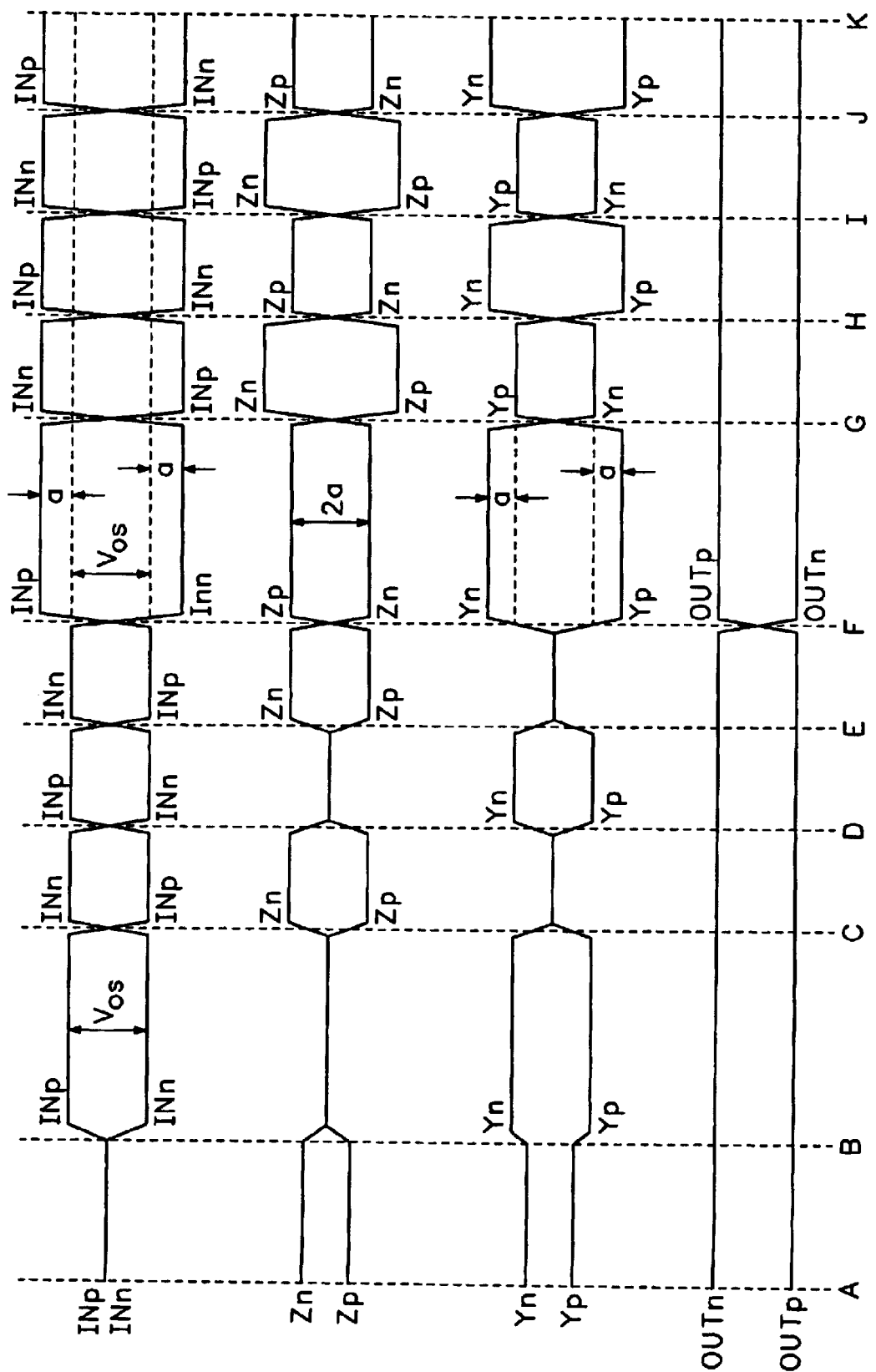
FIG. 4 is a timing diagram illustrating the relationship between input and output voltage levels for the circuit shown in FIG. 2.

FIG. 4 is a timing diagram illustrating the voltage relationships between the signals INn, INp, Zn, Zp, Yn, Yp, OUTn, and OUTp for the detection circuit 210 shown in FIG. 2, and the equivalent detection circuit 222 shown in FIG. 3. In FIG. 2, the source resistances Rs1, Rs2 are equal, so the DC offset voltages Vos1, Vos2 of FIG. 3 are equivalent as well. Thus, the DC offset voltages Vos1, Vos2 of FIG. 3 are illustrated in FIG. 4 as a single offset voltage Vos.

The applied differential input signals INn, INp are illustrated at the top of FIG. 4. Between time A and time B, the differential-mode of the input signals INn, INp is zero, because the difference between INn and INp is zero. Between time B and time F, the input signals INn, INp switch polarity several times, but their differential-mode (except for quick transitions at times C, D, and E) is at the same level as the DC offset voltage Vos. At time F, the differential-mode of the two input signals INn, INp exceeds the DC offset voltage Vos, and the differential-mode remains higher than Vos (except for quick transistions at times G, H, I, and J) through time K.

Zn, Zp and Yn, Yp are the outputs of the mismatched differential amplifiers 212, 214 in FIG. 2. Between times A and B, the inputs INn, INp are at the same voltage level so the outputs Zn, Zp and Yn, Yp differ by an amount equal to the voltage across the source resistances Rs1 and Rs2.

Between times B and F, the differential-mode of the input signals INn, INp is equal to the DC offset voltage Vos. The DC offset voltage Vos is the voltage difference applied to the transistors of a differential amplifiers 212, 214 that is required to force equal currents through each side of one of the differential amplifiers. The particular differential amplifier 212, 214 where this occurs depends on the polarity of the input signals INn, INp. When INp is positive with respect to FNn in an amount equal to the Vos, equal currents flow through the differential amplifier 212, so the output voltages of Zn, Zp are be the same as well (FIG. 4, time B to time C). On the other hand, this only increases the voltage difference between outputs Yn, Yp of differential amplifier 214. Conversely, when INn is positive with respect to INp in an amount equal to the Vos, differential amplifier 214 has equal currents and, as a result, no voltage difference exists between the outputs Yn, Yp (time C to time D).

After time F, the differential-mode of the inputs INn, INp exceeds the DC offset voltage Vos, and the currents through the branches of the differential amplifiers 212, 214 are no longer equal like they were between time B and time F. The differential-mode of the inputs INn, INp are now more than enough to overcome the offset voltage Vos so the additional voltage difference drives the differential amplifier outputs Yn, Yp and Zn, Zp further apart. This is seen by comparing the outputs for nodes Yn, Yp, Zn, and Zp for time segment B-C to the outputs in time segment F-G. In both cases, INp is positive with respect to INn. However, in time segment F-G the differential-mode of inputs INn, INp exceed Vos by an amount a. The differential amplifier outputs Zp, Zn and Yn, Yp in time segment F-G exceed the differential amplifier outputs Zp, Zn and Yn, Yp in time segment B-C by the same amount a, assuming an amplifier gain of 1. A similar result is seen when comparing time segment G-H to time segment C-D (INn is positive with respect to INp). Of course, safety margins may be built into the differential amplifiers 212, 214 such that they amplify the incoming signals by a larger amount than absolutely necessary, in order to ensure the correct output of the detection circuit for most operating conditions.

The output signals OUTn, OUTp are illustrated at the bottom of FIG. 4. The output signals OUTn, OUTp are taken from the differential OR gate 216 that has inputs from the nodes Yn, Yp, Zn, and Zp. The differential OR gate 216 compares the difference between the signals Yn, Yp and Zn, Zp to the DC offset voltage Vos. If the difference between Yn and Yp or Zn and Zp is greater than the DC offset voltage Vos, OUTp is at a high state (times F through K). If the difference between Yn and Yp or Zn and Zp is less than the DC offset voltage, OUTp is in a LOW state (times A through F). OUTn is simply the inverse of OUTp. From time A to time F in FIG. 4, neither Yn, Yp or Zn, Zp have a difference greater than the DC offset voltage Vos. Thus, OUTp remains low. Then, at time F through time K, the difference of either Yn, Yp or Zn, Zp remain greater than the DC offset voltage Vos. In response, OUTp transitions to a high state at time F and remains there through time K.

Figure 5:
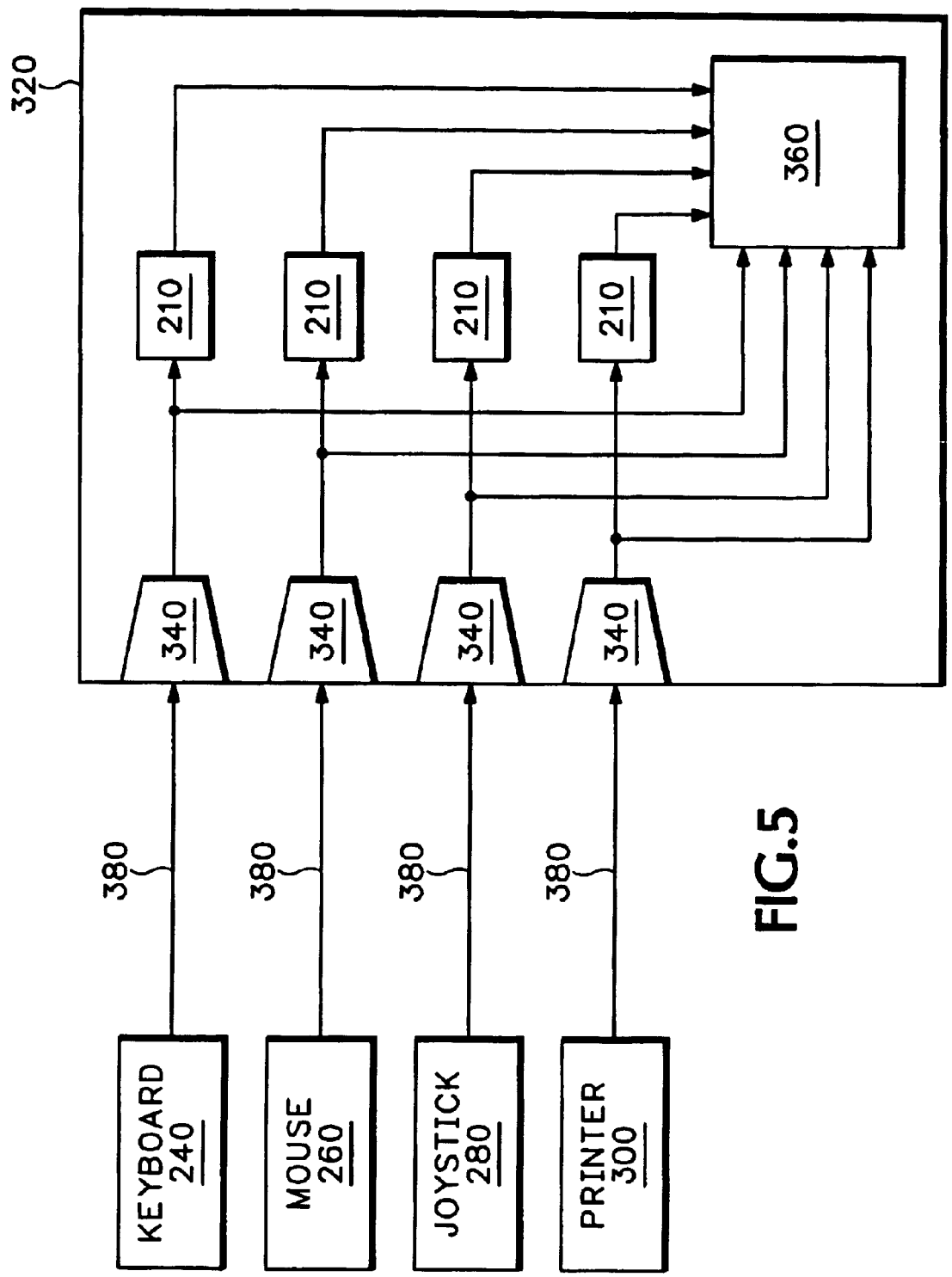
FIG. 5 is a block diagram that illustrates a system incorporating the differential signal detection circuit shown in FIG. 2.

FIG. 5 illustrates an example system that includes several detection circuits 210. A USB hub microcontroller 320 receives data from four different USB peripheral devices: a keyboard 240, a mouse 260, a joystick 280, and a printer 300. Each device is connected to a respective port 340 of the USB hub microcontroller via a USB connection cable 380. As is well known in the art (and not specifically illustrated in FIG. 5), a USB connection cable has four lines for carrying voltage signals—two differential signal lines used for data, a power line, and a ground line. The two USB differential signal lines from the individual cables 380 are tapped at ports 340 and become the differential inputs INn and INp for the connected detection circuits 210. The detection circuits 210 in FIG. 5 can be the same as the circuit 210 in FIG.2, for instance. The outputs of the circuit 210 are coupled to a processor 360, along with the original differential inputs from the ports 340. The processor 360, using the outputs from the circuits 210, can then detect when valid data signals are being sent from the peripheral devices.

In operation, data from one of the peripheral devices is sent through its connected cable 380 to the port 340. As described above, the data lines from the cable 380 couple directly to the processor 360. Additionally, the data lines couple to the detection circuit 210 as inputs INp and INn. As data is sent from a peripheral device, the detection circuit 210 determines if the signal has a large enough degree of opposition to be considered valid data. If the detection circuit 210 determines that the signals are appropriate and within the predetermined specifications for acceptable data transmission, a proper signal is generated at its output, and is communicated to the processing device 360. When the processing device receives the signal, it recognizes the incoming data as valid data and acts on it. If instead the detection circuit 210 determines that the signals are not within the specifications, another type of signal is generated and communicated to the processing device 360. When the processing device receives this second type of signal, it does not recognize the data sent by the peripheral device as valid, and ignores such data.

Although a preferred embodiment and several alternative embodiments of the invention have been described, it will be apparent to those of ordinary skill in the art that the teachings of this disclosure can be extended to encompass other embodiments not previously discussed. As such, the embodiments of the invention should not be considered limited in any way except by the depth and scope of the following claims.

What is claimed is:

1. A differential signal detection device comprising:
    a first differential amplifier coupled to a first differential input and a second differential input, the first differential amplifier including a first leg having a first set of components and a second leg having a second set of components, the first set of components not matching the second set of components;
    a second differential amplifier coupled to the first differential input and the second differential input, the second differential amplifier including a third leg having a third set of components and a fourth leg having a fourth set of components, the third set of components not matching the fourth set of components; and
    an indication circuit coupled to the first differential amplifier and the second differential amplifier, the indication circuit structured to generate a signal based on output signals from the first and second differential amplifiers.

2. The device of claim 1,
    wherein the first leg and second leg are coupled in parallel between a supply voltage and a first current source, the first current source being connected to a reference voltage;
    wherein the first and second sets of components each include a respective load element coupled to a respective transistor;
    wherein the first differential input is coupled to a gate of the respective transistor in the first leg and the second differential input is coupled to a gate of the respective transistor in the second leg; and
    wherein an additional component is coupled to a drain of the respective transistor in one of the first or second legs.

3. The device of claim 2,
    wherein the third leg and the fourth leg are connected in parallel between the supply voltage and a second current source, the second current source being connected to the reference voltage;
    wherein the third and fourth sets of components each include a respective load element coupled to a respective transistor;
    wherein the first differential input is coupled to a gate of the respective transistor in the third leg and the second differential input is coupled to a gate of the respective transistor in the fourth leg, and
    wherein an additional component is coupled to a drain of the respective transistor in one of the third or fourth legs.

4. The device of claim 3, wherein at least one of the load elements is an active load.

5. The device of claim 1,
    wherein one of the legs in the first differential amplifier includes a first resistance not present in the other leg of the first differential amplifier;
    wherein one of the legs in the second differential amplifier includes a second resistance not present in the other leg of the second differential amplifier,
    wherein the first and second resistances are substantially equal to one another; and
    wherein the first and second differential amplifiers have a gain equal to one.

6. The device of claim 1, wherein the indication circuit comprises:
    an OR gate having inputs coupled to the first, second, third, and fourth legs; and
    a buffer, having an input coupled to an output of the OR gate.

7. The device of claim 1,
    wherein the first and the second differential inputs are respectively coupled to a first and second signal line of a universal serial bus.

8. A data bus signal detection system comprising:
    a first input terminal structured to be coupled to a first signal line of a data bus;
    a second input terminal structured to be coupled to a second signal line of the data bus;
    a first differential amplifier coupled to the first input terminal and the second input terminal, the f differential amplifier including a first leg having a first set of components and a second leg having a second set of components, the first set of components not matching the second set of components;
    a second differential amplifier coupled to the first input terminal and the second input terminal, the second differential amplifier including a third leg having a third set of components and a fourth leg having a fourth set of components, the third set of components not matching the fourth set of components; and
    an indication circuit structured to produce a signal based on output signals from the first and second differential amplifiers.

9. The system of claim 8,
    wherein the first leg and second leg are coupled in parallel between a supply voltage and a first current source, the first current source being coupled to a reference voltage;
    wherein the first and second sets of components each include a respective load element coupled to a respective transistor;

wherein the first input terminal is coupled to a gate of the transistor in the first leg and the second input terminal is coupled to a gate of the transistor in the second leg; and wherein an additional component is coupled to a drain of the transistor in one of the first or second legs.

10. The system of claim 9, wherein the third leg and the fourth leg are coupled in parallel between the supply voltage and a second current source, the second current source being coupled to the reference voltage;

wherein the third and fourth sets of components each include a respective load element coupled to a respective transistor;

wherein the first input terminal is coupled to a gate of the transistor in the third leg and the second input terminals coupled to a gate of the transistor in the fourth leg, and wherein an additional component is coupled to a drain of the transistor in one of the third or fourth legs.

11. The system of claim 10, wherein at least one of the load elements is an active load.

12. The system of claim 8, wherein one of the legs in the first differential amplifier further comprises a first resistance not present in the other leg of the first differential amplifier;

wherein one of the legs in the second differential amplifier further comprises a second resistance not present in the other leg of the second differential amplifier;

wherein the first and second resistances are substantially equal to one another; and wherein the first and second differential amplifiers have a gain equal to one.

13. The system of claim 8, wherein the indication circuit comprises:

an OR gate having inputs coupled to the first, second, third, and fourth legs; and a buffer having an input coupled to an output of the OR gate.

14. The system of claim 8, wherein the first and the second input terminals are respectively coupled to a first and second signal line of a universal serial bus.

15. A method for detecting differential signals comprising:

applying a first differential signal to a first leg of a first differential amplifier and a second differential signal to a second leg of the first differential amplifier, wherein the first and second legs of the first differential amplifier are dissimilar from one another;

applying the first differential signal to a first leg of a second differential amplifier and the second differential signal to a second leg of the second differential amplifier, wherein the first and second legs of the second differential amplifier are dissimilar from one another;

comparing signals from the legs in the first and second differential amplifiers in a logic circuit; and generating an output from the logic circuit based on the comparison.

16. The method of claim 15, wherein applying a first differential signal to a first leg of a first differential amplifier and a second differential signal to a second leg of the first differential amplifier comprises coupling the first differential signal to a first data signal of a universal serial bus, and coupling the second differential signal to a second data signal of the universal serial bus.

17. The method of claim 16, wherein applying the first differential signal to a first leg of a second differential amplifier and the second differential signal to a second leg of the second differential amplifier comprises coupling the first differential signal to a first data signal of a universal serial bus, and coupling the second differential signal to a second data signal of the universal serial bus.

18. The method of claim 17, wherein comparing signals from the legs in the first and second differential amplifiers comprises:

accepting signals from the first and second legs of the first differential amplifier, and from the first and second legs of the second differential amplifier, the first and second differential amplifiers having a gain equal to one; and performing a logic operation on the accepted signals.

19. The method of claim 18, wherein performing a logic operation comprises performing an OR function.

20. The method of claim 19, wherein generating an output from the logic circuit comprises buffering a signal produced as a result of performing the OR function.

21. A differential signal detection device comprising:

a first differential amplifier with a gain substantially equal to one coupled to a first differential input and a second differential input, the first differential amplifier including a first leg having a first set of components and a second leg having a second set of components, the first set of components not matching the second set of components, the first leg including a fist resistance not present in the second leg;

a second differential amplifier with a gain substantially equal to one coupled to the first differential input and the second differential input, the second differential amplifier including a third leg having a third set of components and a fourth leg having a fourth set of components, the third leg including a second resistance not present in the fourth leg, the first and second resistances substantially equal to each other; and an indication circuit coupled to the first differential amplifier and the second differential amplifier, the indication circuit structured to generate a signal based on output signals from the first and second differential amplifiers.

22. A differential signal detection device comprising:

a first differential amplifier coupled to a first differential input and a second differential input, the first differential amplifier including a first leg having a first set of components and a second leg having a second set of components, the first set of components not matching the second set of components;

a second differential amplifier coupled to the first differential input and the second differential input, the second differential amplifier including a third leg having a third set of components and a fourth leg having a fourth set of components, the third set of components not matching the fourth set of components; and an indication circuit coupled to the first differential amplifier and the second differential amplifier, the indication circuit structured to generate a signal based on output signals from the first and second differential amplifiers, the indication circuit including an OR gate having inputs coupled to the first, second, third and fourth legs and a buffer having an input coupled to an output of the OR gate.

23. A data bus signal detection system comprising:

a first input terminal;

a second input terminal;

a first differential amplifier with a gain substantially equal to one coupled to the first input terminal and the second input terminal, the first differential amplifier including a first leg having a first set of components and a second leg having a second set of components, the first leg having a first resistance not present in the second leg;

a second differential amplifier with a gain substantially equal to one coupled to the first input terminal and the second input terminal, the second differential amplifier including a third leg having a third set of components and a fourth leg having a fourth set of components, the third leg having a second resistance not present in the fourth leg, the first and second resistances substantially equal to each other; and an indication circuit structured to produce a signal based on output signals from the first and second differential amplifiers.

24. A data bus signal detection system comprising:

a first input terminal;

a second input terminal;

a first differential amplifier coupled to the first input terminal and the second input terminal, the first differential amplifier including a first leg having a first set of components and a second leg having a second sot of components, the first set of components not matching the second set of components;

a second differential amplifier coupled to the first input terminal and the second input terminal, the second differential amplifier including a third leg having a third set of components and a fourth leg having a fourth set of components, the third set of components not matching the fourth set of components; and an indication circuit structured to produce a signal based on output signals from the first and second differential amplifiers, the indication circuit including an OR gate coupled to the first, second, third, and fourth legs and a buffer having an input coupled to an output of the OR gate.

* * * * *

UNITED STATES PATENT AND TRADEMARK OFFICE
CERTIFICATE OF CORRECTION

PATENT NO.    : 6,781,465 B1
DATED         : August 24, 2004
INVENTOR(S)   : Berzins et al.

It is certified that error appears in the above-identified patent and that said Letters Patent is hereby corrected as shown below:

Column 1,
Line 28, "source 12 to bias" should read -- source I2 to bias --.
Line 35, "source 11 and" should read -- source I1 and --.
Line 37, "source 15 and" should read -- source 12, and --.

Column 2,
Line 64, "source 12, and" should read -- source I2, and --.

Column 3,
Line 49, "source 15 and" should read -- source I5 and --.

Column 5,
Line 23, "to the gales of the" should read -- to the gates of the --.

Column 6,
Line 4, "FNn in an" should read -- INn in an --.

Column 8,
Line 24, "differential amplifier," should read -- differential amplifier; --.
Lines 35-38, "claim 1, wherein the first and the second differential inputs are respectively coupled to a first and second signal line of a universal serial bus." should read -- claim 1, further comprising: a first and a second universal serial bus terminal coupled to the first and the second differential inputs, respectively. --.
Lines 40-41, "input terminal structured to be coupled to a first signal line of a data bus;" should read -- input terminal; --.
Lines 42-43, "input terminal structured to be coupled to a second signal line of the data bus;" should read -- input terminal; --.
Line 45, "the f differential" should read -- the first differential --.

Column 9,
Line 17, "input terminals coupled" should read -- input terminal is coupled --.
Lines 41-43, "claim 8, wherein the first and the second input terminals are respectively coupled to a first and second signal line of a universal serial bus." should read -- claim 8, the first and the second input terminals comprising a first and a second universal serial bus input terminal, respectively. --

UNITED STATES PATENT AND TRADEMARK OFFICE
CERTIFICATE OF CORRECTION

PATENT NO. : 6,781,465 B1
DATED : August 24, 2004
INVENTOR(S) : Berzins et al.

It is certified that error appears in the above-identified patent and that said Letters Patent is hereby corrected as shown below:

Column 10,
Line 33, "a fist resistance" should read -- a first resistance --.

Column 12,
Line 7, "a second sot of" should read -- a second set of --.

Signed and Sealed this

Twenty-sixth Day of April, 2005

JON W. DUDAS
*Director of the United States Patent and Trademark Office*